United States Patent
Nagarajan

(10) Patent No.: US 6,201,691 B1
(45) Date of Patent: Mar. 13, 2001

(54) REMOVABLE ELECTRONIC SUBASSEMBLY WITH A COMPRESSIBLE SHOCK ABSORBING DEVICE

(75) Inventor: Subrahmanyan Nagarajan, Auburn, MA (US)

(73) Assignee: International Business Machines Corporation, Armonk, NY (US)

( * ) Notice: Subject to any disclaimer, the term of this patent is extended or adjusted under 35 U.S.C. 154(b) by 969 days.

(21) Appl. No.: 08/751,375

(22) Filed: Nov. 19, 1996

Related U.S. Application Data

(63) Continuation of application No. 08/361,410, filed on Dec. 22, 1994, now abandoned.

(51) Int. Cl.⁷ .................. H05K 7/00; G06F 1/16
(52) U.S. Cl. .............. 361/685; 361/683; 361/737; 206/312; 248/560; 248/632
(58) Field of Search ............. 361/683–686, 361/737; 248/632, 560–562; 206/307, 308, 312, 319, 523; 220/4.02

(56) References Cited

U.S. PATENT DOCUMENTS

| | | | |
|---|---|---|---|
| 4,499,996 | 2/1985 | Coyle | 206/444 |
| 4,692,831 | 9/1987 | Suzuki | 360/133 |
| 4,937,806 | 6/1990 | Babson et al. | 369/75.1 |
| 5,021,905 | 6/1991 | Sleger | 360/97.02 |
| 5,161,770 | * 11/1992 | Morehouse et al. | 248/632 |
| 5,204,794 | 4/1993 | Yoshida | 360/133 |
| 5,207,327 | 5/1993 | Brondos | 206/523 |
| 5,214,550 | 5/1993 | Chan | 360/97.01 |
| 5,216,582 | 6/1993 | Russell et al. | 361/395 |
| 5,223,996 | 6/1993 | Read et al. | 360/97.02 |
| 5,402,308 | 3/1995 | Koyanagi et al. | 361/685 |

FOREIGN PATENT DOCUMENTS

| | | |
|---|---|---|
| 0610025 | 8/1994 | (EP) . |
| WO9411873 | 5/1994 | (WO) . |

OTHER PUBLICATIONS

Electronic Design, vol. 43, No. 1, Jan. 9, 1995, pp. 79/80, 82, 86/87, XP 000494943, R. Nass, "Plug Into PCMCIA for Portable Mass Storage".

D.J. Kalendra, IBM Technical Disclosure Bulletin, vol. 32, No. 6B, Nov. 1989 "Compressed/Expandable Removable Disk Stack Storage Concept" pp. 150–152.

* cited by examiner

*Primary Examiner*—Jayprakash N. Gandhi
(74) *Attorney, Agent, or Firm*—Felsman, Bradley, Vaden, Gunter & Dillon

(57) ABSTRACT

A removable electronic subassembly is designed for placement into a data processing system which requires said removable electronic subassembly to fit into an aperture defining a selected form factor. The removable electronic subassembly comprises a rigid enclosure which encloses interior components of the removable electronic subassembly. The rigid enclosure has exterior dimensions which are smaller than the selected form factor. A layer of resilient material is mounted to an exterior of the rigid enclosure. The layer of resilient material and the rigid enclosure have at least one exterior dimension which exceeds the selected form factor in an uncompressed state wherein the resilient material may be compressed such that the at least one exterior dimension conforms to the selected form factor.

17 Claims, 3 Drawing Sheets

REMOVABLE ELECTRONIC SUBASSEMBLY WITH A COMPRESSIBLE SHOCK ABSORBING DEVICE

This is a continuation, of application Ser. No. 08/361,410, filed Dec. 22, 1994, now abandoned.

BACKGROUND OF THE INVENTION

1. Technical Field

The present invention relates in general to improvements in removable electronic subassemblies which must fit into an aperture of a data processing system defining a selected form factor, and in particular to an improved removable electronic subassembly having a compressible shock absorbing layer which does not conform to the predetermined form factor when outside the aperture, but which can be compressed to fit within the aperture of the data processing system.

2. Description of the Related Art

The use of removable electronic subassemblies in conjunction with data processing systems is continually increasing in the computer field. Removable electronic subassemblies such as disk drives, modems, network interfaces, and the like are often used in conjunction with data processing systems such as computers and the like. For purposes of interchangeability, the removable electronic subassemblies are required to fit into an aperture defining a selected "form factor" in the data processing system.

With the increased use of removable electronic subassemblies and the decrease in size of the same, it is becoming increasingly more common to transport the removable electronic subassemblies while not connected to or inserted within the data processing system. While being transported, the removable electronic subassemblies are frequently dropped and inadvertently tossed around. To avoid damage to the removable electronic subassemblies, these subassemblies must be able to withstand a certain amount of shock.

It has been a continuing objective of the computer industry to increase the capacity and functions of any given size of removable electronic subassembly. In order to increase the capacity or functions of the various removable electronic subassemblies it is desired to have increased usable volume for the inner working components. The maximum exterior dimensions of the removable electronic subassembly, however, are dictated by the form factor of the aperture of the data processing system within which the removable electronic subassembly must fit.

To allow the removable electronic subassemblies to withstand a certain amount of shock, a certain amount of the usable volume must be used for shock absorbing devices, thereby decreasing the amount of volume available for the inner working components of the removable electronic subassembly. Alternatively, the use of shock absorbing devices can be minimized, but the interior components of the removable electronic subassembly must be stronger and more rugged so as to withstand an increased amount of shock. When components are made stronger and more rugged they also increase in size, therefore decreasing the capacity of the removable electronic subassembly.

With the continuing trend in the computer industry to reduce the volume of the data processing systems, it has also become necessary to reduce the size of the aperture within which the removable electronic subassemblies must fit. Therefore, the removable electronic subassemblies must have increasingly smaller form factors. One example of removable electronic subassemblies which must have small form factors are PCMCIA devices. PCMCIA is an acronym for Personal Computer Memory Card International Association. PCMCIA devices are usually about two to three inches wide and three to four inches long. PCMCIA devices have various standard thicknesses ranging from just a few millimeters to about ten millimeters. All the necessary components for devices such as disk drives, modems, and the like must fit within such small volumes.

PCMCIA devices are expected to handle high shock inputs, and are expected to be rugged for ease of portability. The industry standards for PCMCIA devices require that such devices survive drops of 30 inches onto a cushionless floor or desk, the purpose being to allow such devices to be carried around like inexpensive calculators or cassette cartridges.

Achieving the desired shock and fragility resistance for such devices is not so much a challenge, as is meeting these requirements within space and cost constraints. As discussed above, shock absorbing devices can be easily provided, but at the expense of usable volume. The use of shock absorbing devices greatly reduces the shock felt by the inner components, thereby avoiding the need of shock resistant inner components. However, the amount of volume lost to shock absorbing devices greatly restricts the capacity and functions of the devices. Alternatively, less volume can be used for shock absorbing devices, but this requires stronger and more shock resistant inner components. In addition to adding to the cost of the devices, stronger and more shock resistant inner components are also generally thicker and larger and therefore do not allow the device to obtain its maximum capacity and function.

SUMMARY OF THE INVENTION

It is therefore an object of the present invention to provide an improved removable electronic subassembly.

It is another object of the present invention to provide an improved removable electronic subassembly capable of handling high shock inputs.

It is another object of the present invention to provide an improved removable electronic subassembly which handles high shock inputs and conforms to a predefined form factor, allowing the subassembly to fit into an aperture of a data processing system.

It is another object of the present invention to provide an improved removable electronic subassembly which maximizes the amount of usable space for the interior components of the removable electronic subassembly, while making the removable electronic subassembly resistant to high shock inputs.

It is another object of the present invention to provide an improved removable electronic subassembly with a shock absorbing device which utilizes a minimum amount of volume within the predetermined form factor.

The foregoing objects are achieved as is now described. The removable electronic subassembly is designed for placement into a data processing system which requires said removable electronic subassembly to fit into an aperture defining a selected form factor. The removable electronic subassembly comprises a rigid enclosure which encloses interior components of said removable electronic subassembly. The rigid enclosure has exterior dimensions which are smaller than said selected form factor. A layer of resilient material is mounted to an exterior of said rigid enclosure. The layer of resilient material and the rigid enclosure have at least one exterior dimension which exceeds the selected form factor in an uncompressed state wherein the resilient material may be compressed such that the at least one exterior dimension conforms to the selected form factor to permit insertion of the subassembly.

The above as well as additional objectives, features, and advantages of the present invention will become apparent in the following detailed written description.

DESCRIPTION OF THE DRAWINGS

The novel features believed characteristic of the invention are set forth in the appended claims. The invention itself however, as well as a preferred mode of use, further objectives and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
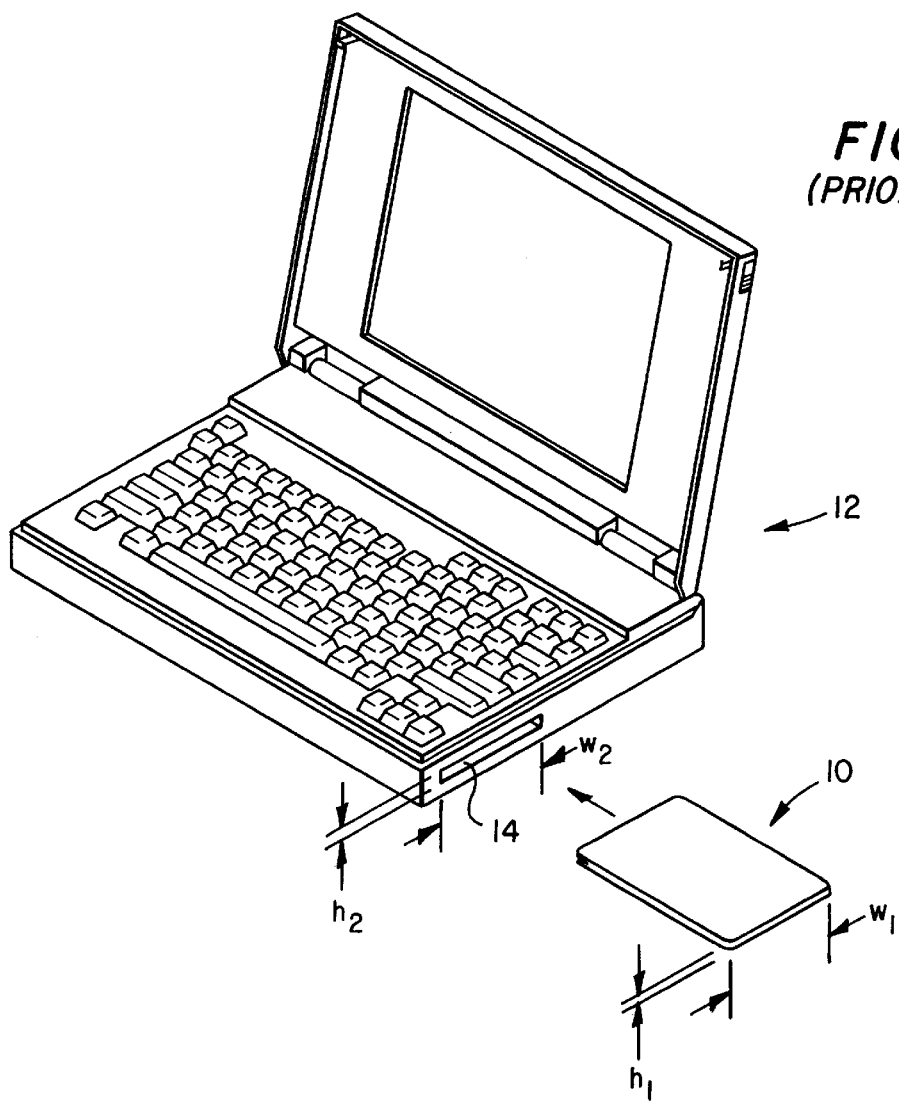
FIG. 1 is a perspective view of a removable electronic subassembly and a data processing system provided in accordance with the prior art.

With reference now to the figures and in particular with reference to FIG. 1, there is depicted a perspective view of a removable electronic subassembly 10 and a data processing system 12 provided in accordance with the prior art. Data processing system 12 is illustrated in FIG. 1 as a laptop computer, but could be any one of the wide variety of data processing systems such as ordinary computers, printers, and the like. Removable electronic subassembly 10 is illustrated in FIG. 1 as a PCMCIA disk drive, but could be any one of a wide variety of removable electronic subassemblies such as disk drives, modems, network interfaces, and the like, which are required to meet a particular form factor. Data processing system 12 has an aperture 14 for accepting the removable electronic subassembly 10. Removable electronic subassembly 10 has an exterior height $h_1$ and an exterior width $w_1$. Aperture 14 in data processing system 12 has a height $h_2$ and width $w_2$. Height $h_1$ and width $w_1$ of removable electronic subassembly 10 are smaller than height $h_2$ and width $w_2$ of aperture 14, therefore allowing removable electronic subassembly 10 to be inserted into aperture 14.

Figure 2:
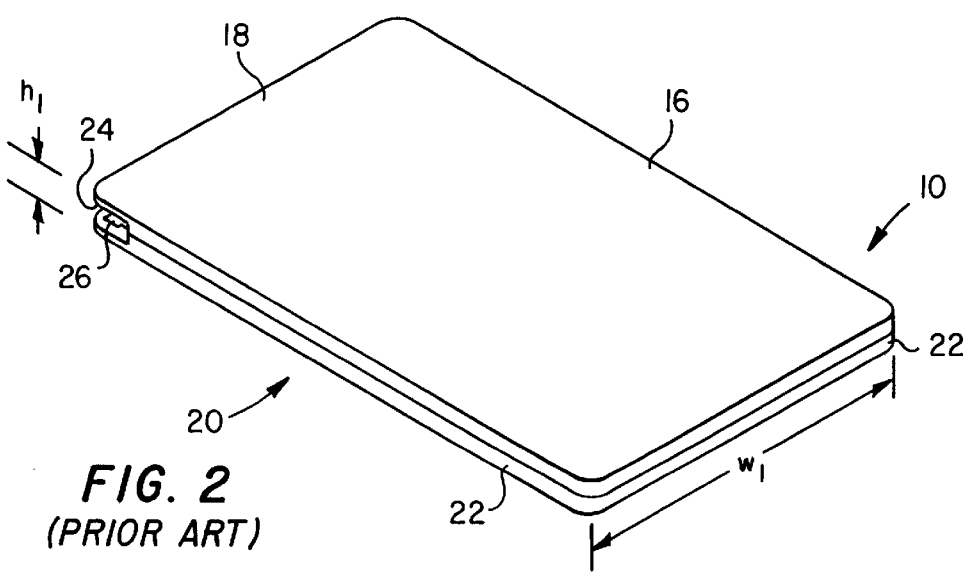
FIG. 2 is a perspective view of a removable electronic subassembly in accordance with the prior art.

FIG. 2 shows a perspective view of removable electronic subassembly 10. The external height $h_1$ and external width $w_1$ removable electronic subassembly 10 are shown. Removable electronic subassembly 10 comprises a rigid enclosure 16 having an upper surface 18, lower surface 20 (not shown in FIG. 2), and side edge 22. Rigid enclosure 16 houses the internal components (not shown) of removable electronic subassembly 10. A coupling 24 is located along a portion of side edge 22 for mating with a coupling (not shown) located within aperture 14 of data processing system 12. Located on coupling 24 is an interface 26 which extends through rigid enclosure 16 for allowing data to be transferred between removable electronic subassembly 10 and data processing system 12.

Figure 3:
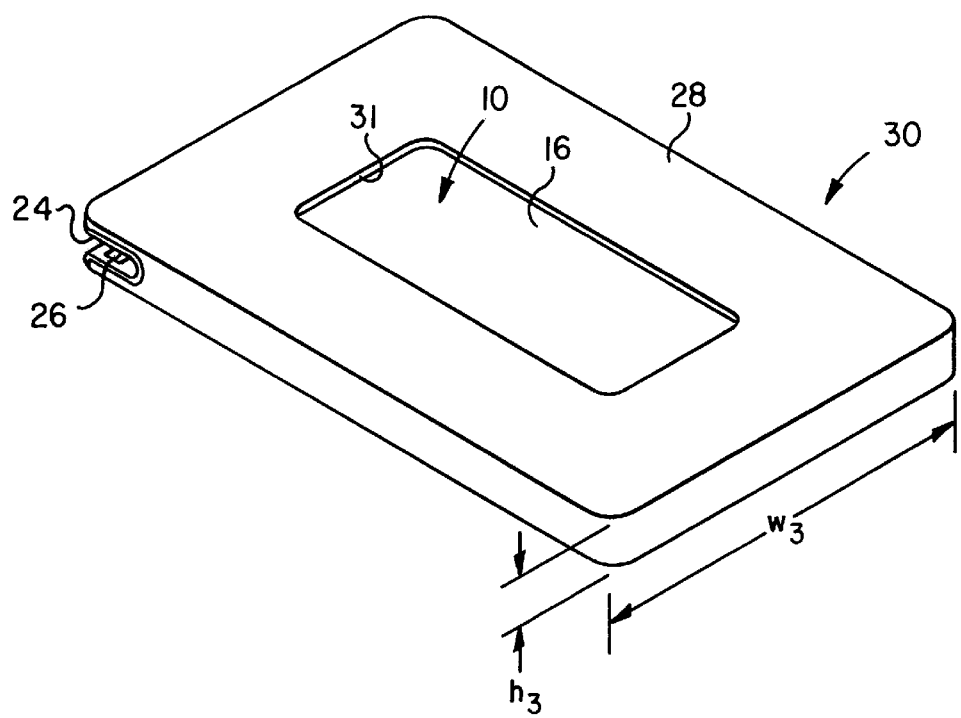
FIG. 3 is a perspective view of an embodiment of the improved removable electronic subassembly of the present invention.
Figure 4:
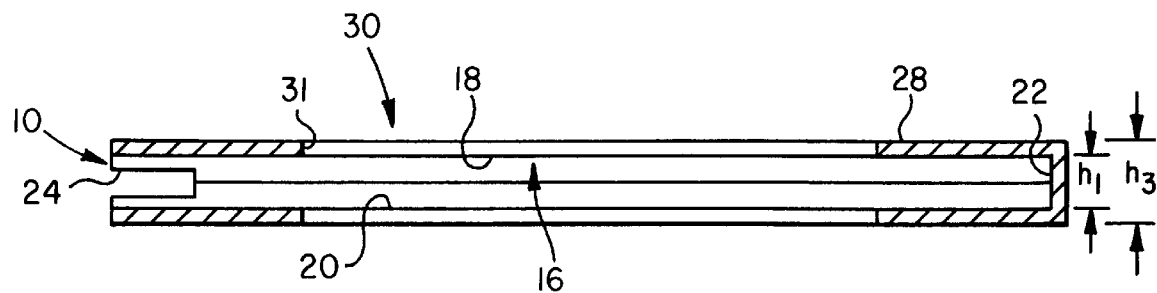
FIG. 4 is cross-sectional side view of the removable electronic subassembly of FIG. 3 with the layer of resilient material shown in the uncompressed state.

Referring now to FIGS. 3 and 4, an improved removable electronic subassembly 30 manufactured according to the present invention is shown. A removable electronic subassembly 10 of the type shown in FIGS. 1 and 2, and having an external height $h_1$ and an external width $w_1$ is provided. Removable electronic subassembly 10 has a coupling 24 and an interface 26. A layer of resilient material 28 is selectively mounted to the exterior of removable electronic subassembly 10. In the preferred embodiment which is shown in FIGS. 3 and 4, the layer of resilient material 28 covers side edge 22 of removable electronic subassembly 10, and portions of upper surface 18 and lower surface 20 as shown in FIGS. 3 and 4. Coupling 24 and interface 26 are not covered with layer of resilient material 28 so as to allow effective coupling with data processing system 12 and so as to allow effective data transfer between removable electronic subassembly 10 and data processing system 12 through interface 26. Removable electronic subassembly 10 and layer of resilient material 28 comprise the improved removable electronic subassembly 30.

Removable electronic subassembly 30 has an external height $h_3$. External height $h_3$ comprises height $h_1$ of removable electronic subassembly 10 and the thickness of layer of resilient material 28. When in the uncompressed state, height $h_3$ of removable electronic subassembly 30 exceeds height $h_2$ of aperture 14 of data processing system 12.

Removable electronic subassembly 30 has an external width $W_3$. External width $W_3$ comprises width $w_1$ of removable electronic subassembly 10 and the thickness of layer of resilient material 28. When in the uncompressed state, width $W_3$ of removable electronic subassembly 30 exceeds width $w_2$ of aperture 14 of data processing system 12.

Figure 5:
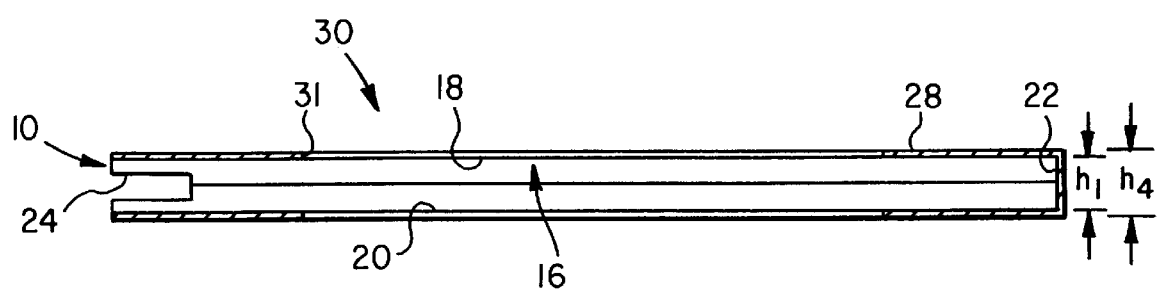
FIG. 5 is a cross-sectional side view of the removable electronic subassembly of FIG. 3 with the layer of resilient material shown in the compressed state.

Although external height $h_3$ and external width $w_3$ of removable electronic subassembly 30 are greater than height $h_2$ and width $w_2$ of aperture 14, when the layer of resilient material 28 is in the uncompressed state, the layer of resilient material 28 can be compressed, as shown in FIG. 5, so that the compressed external height $h_4$ and compressed external width w4 (external width $w_4$ is not visible in FIG. 5) are substantially equal to, or slightly smaller than, height $h_2$ and width $w_2$ of aperture 14 of data processing system 12.

The layer of resilient material 28 can be manufactured from any suitable resilient material, such as a polymeric material, a foam-like material, or a sponge-like material, which will sufficiently absorb the shock which may be imparted to removable electronic subassembly 10. The thickness of the layer of resilient material 28 is selected such that the layer of resilient material 28 is thick enough to protect rigid enclosure 16 from excessive shock inputs, yet thin enough so that the layer of resilient material 28 may be compressed sufficiently to fit within the form factor defined by height $h_2$ and width $w_2$ of aperture 14 of data processing system 12, thus allowing removable electronic subassembly 30 to fit within aperture 14.

Another consideration in selecting the appropriate material and thickness of the layer of resilient material 28 is to control the forces imparted by the expanding layer of resilient material 28 on aperture 14 and on rigid enclosure 16. When the layer of resilient material 28 is compressed and removable electronic subassembly 30 inserted into aperture 14 of the data processing system 12, the layer of resilient material 28 tends to expand and exert forces on the interior of aperture 14 of data processing system 12. The forces exerted against the interior of aperture 14 also result in forces being exerted against rigid enclosure 16. The type of material and thickness of layer of resilient material 28 must therefore be selected so as to keep these forces at a level which does not negatively effect the operation of data processing system 12 or removable electronic subassembly 10.

The embodiment shown in FIGS. 3, 4, and 5 illustrates the layer of resilient material 28 having a window, or opening 31, for exposing rigid enclosure 16. Window 31 is not necessary, but can facilitate the placement of indicia on rigid enclosure 16. Alternatively, layer or resilient material 28 can cover the entire upper surface 18 and lower surface 20, and the indicia may be located on the layer of resilient material 28.

Figure 6:
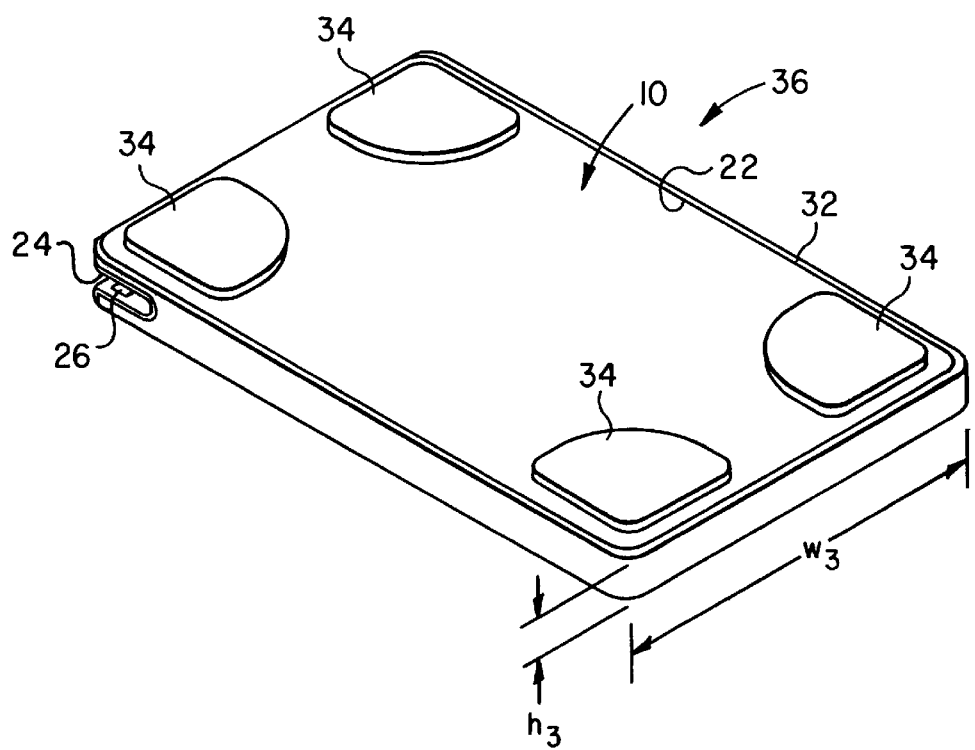
FIG. 6 is a perspective view of an embodiment of the improved removable electronic subassembly of this invention, showing an alternative embodiment for the mounting of the layer of resilient material to the exterior of the removable electronic subassembly.

FIG. 6 illustrates an alternative embodiment for the placement of resilient material on removable electronic subassembly 10. As shown in FIG. 6, the layer of resilient material 32 is located along side edge 22 of removable electronic subassembly 10. The layer of resilient material 32 does not cover coupling 24 and interface 26. Also, pads of resilient material 34 are selectively located on upper surface 18 and lower surface 20 (lower surface 20 is not visible). Removable electronic subassembly 10 and resilient material 32 and 34 comprise improved removable electronic subassembly 36. Resilient material 32 and 34 provide shock protection to removable electronic subassembly 10, while reducing the amount of resilient material used.

The improved electronic subassembly of this invention provides considerable advantages over the prior art removable electronic subassemblies. Removable electronic subassemblies require the most amount of shock absorption when the subassemblies are not located within data processing system 12, since in that state the subassemblies are more prone to being dropped or otherwise mishandled. The layer of resilient material mounted to the improved removable electronic subassembly of this invention provides the greatest amount of shock absorption when the removable electronic subassembly is not located within the data processing system.

When the improved removable electronic subassembly of this invention is not located within the data processing system, the layer of resilient material is in its expanded position and therefore can provide the greatest amount of shock absorption. When in the expanded position, the overall exterior dimensions of the improved removable electronic subassembly of this invention are greater than the selected form factor of the aperture in the data processing system. However, this is inconsequential because the layer of resilient material can be compressed to conform to the predetermined form factor of the aperture, so that the improved removable electronic subassembly can fit within the aperture of the data processing system.

The fact that the improved removable electronic subassembly is slightly out of form factor when not located inside the data processing system is of little consequence. The slightly larger volume of the improved removable electronic subassembly does not greatly affect its portability. In fact, the layer of resilient material makes the improved removable electronic subassembly less slippery and easier to grip, thus making it easier to carry and decreasing the likelihood of it being inadvertently dropped.

Another advantage of the improved removable electronic subassembly of this invention is that once the layer of resilient material is compressed and the removable electronic subassembly inserted into the aperture of the data processing system, the layer of resilient material exerts forces on the interior of the aperture of the data processing system which tend to firmly maintain the removable electronic subassembly within the aperture. These forces, caused by the layer of resilient material expanding against the interior of the aperture, eliminate the "slop" that is often present between the removable electronic subassembly and the data processing system. Also, these forces dampen vibratory inputs to the removable electronic subassembly. The elimination of "slop" and the dampening of the vibratory inputs allows the inner components of the removable electronic subassembly to function more reliably. For example, if the removable electronic subassembly is a disk drive, the dampening of the vibratory inputs allows more aggressive seeking thus increasing the performance of the disk drive.

Another advantage of the improved removable electronic assembly of this invention is that the layer of resilient material which acts as a shock absorbing device for the removable electronic subassembly mainly occupies a volume outside of the predetermined form factor, it does not take up volume which can be otherwise utilized for the internal components of the removable electronic subassembly. Thus, most of the volume defined by the selected form factor of the aperture of the data processing system can be utilized by the internal components of the removable electronic subassembly thus allowing the increase in the capacity and functions of the removable electronic subassembly. The layer of resilient material which comprises the shock absorbing device, although initially making the exterior dimensions of the improved removable electronic subassembly larger than the predetermined form factor, can be compressed so that the exterior dimensions of the improved removable electronic subassembly conform to the selected form factor of the aperture of the data processing system. Because the layer or resilient material is in the compressed state when located inside the data processing system, it occupies less space than when the removable electronic subassembly is not located inside the data processing system, thus allowing greater volume for the internal components of the removable electronic subassembly.

While the invention has been particularly shown and described with reference to a preferred embodiment, it will be understood by those skilled in the art that various changes in form and detail may be made therein without departing from the spirit and scope of the invention.

What is claimed is:

1. A removable electronic subassembly for placement into a data processing system which requires said removable electronic subassembly to fit into an aperture defining a selected form factor, said removable electronic subassembly comprising:

a rigid enclosure which encloses interior components of said removable electronic subassembly, said rigid enclosure having exterior dimensions which are smaller than said selected form factor; and a layer of resilient material mounted to an exterior of said rigid enclosure, said layer of resilient material and said rigid enclosure having at least one exterior dimension substantially exceeding said selected form factor in an uncompressed state wherein said resilient material may be substantially compressed such that said at least one exterior dimension conforms to said selected form factor.

2. A removable electronic subassembly according to claim 1 wherein said removable electronic subassembly comprises a disk drive.

3. A removable electronic subassembly according to claim 1 wherein said removable electronic subassembly comprises a PCMCIA device.

4. A removable electronic subassembly according to claim 1 wherein said rigid enclosure comprises a side edge and wherein said layer of resilient material covers at least a portion of said side edge.

5. A removable electronic subassembly according to claim 1 wherein said rigid enclosure comprises an upper surface and a lower surface and wherein said layer of resilient material covers at least a portion of each of said upper surface and said lower surface.

6. A removable electronic subassembly according to claim 1 wherein said rigid enclosure comprises an upper surface, a lower surface, and a side edge, and wherein said layer of resilient material covers at least a portion of each of said upper surface, said lower surface, and said side edge.

7. A removable electronic subassembly according to claim 1 wherein said layer of resilient material comprises a polymeric material.

8. A removable electronic subassembly according to claim 1 wherein said layer of resilient material comprises a foam-like material.

9. A disk drive assembly for placement into a data processing system which requires said disk drive assembly to fit into an aperture defining a selected form factor, said disk drive assembly comprising:
   a rigid enclosure which encloses interior components of said disk drive assembly, said rigid enclosure having exterior dimensions which are smaller than said selected form factor;
   an interface means extending through said rigid enclosure for allowing data to be transferred between said disk drive assembly and said data processing system;
   a layer of resilient material mounted to an exterior of said rigid enclosure, said layer of resilient material and said rigid enclosure having at least one exterior dimension substantially exceeding said selected form factor in an uncompressed state wherein said resilient material may be substantially compressed such that said at least one exterior dimension conforms to said selected form factor; and
   said interface means being free of said layer of resilient material.

10. A disk drive assembly according to claim 9 wherein said disk drive assembly comprises a PCMCIA device.

11. A disk drive assembly according to claim 9 wherein said rigid enclosure comprises a side edge and wherein said layer of resilient material covers at least a portion of said side edge.

12. A disk drive assembly according to claim 9 wherein said rigid enclosure comprises an upper surface and a lower surface and wherein said layer of resilient material covers at least a portion of each of said upper surface and said lower surface.

13. A disk drive assembly according to claim 9 wherein said rigid enclosure comprises an upper surface, a lower surface, and a side edge, and wherein said layer of resilient material covers at least a portion of each of said upper surface, said lower surface, and said side edge.

14. A disk drive assembly according to claim 9 wherein said layer of resilient material comprises a polymeric material.

15. A disk drive assembly according to claim 9 wherein said layer of resilient material comprises a foam-like material.

16. A method of manufacturing a removable electronic subassembly for placement into a data processing system which requires said removable electronic subassembly to fit into an aperture defining a selected form factor, the method comprising the steps of:
   enclosing interior components of said removable electronic subassembly within a rigid enclosure having exterior dimensions which are smaller than said selected form factor; and
   mounting a layer of resilient material onto at least a portion of said rigid enclosure so that said layer of resilient material and said rigid enclosure have at least one exterior dimension substantially exceeding said selected form factor in an uncompressed state, wherein said resilient material may be substantially compressed such that said at least one exterior dimension conforms to said selected form factor.

17. A method of protecting a removable electronic subassembly designed for operation within a data processing system which requires said removable electronic subassembly to fit into an aperture defining a selected form factor, the method comprising the steps of:
   enclosing interior components of said removable electronic subassembly within a rigid enclosure having exterior dimensions which are smaller than said selected form factor: and
   mounting a layer of resilient material onto at least a portion of said rigid enclosure so that said layer of resilient material and said rigid enclosure have at least one exterior dimension substantially exceeding said selected form factor in an uncompressed state, wherein said resilient material may be substantially compressed such that said at least one exterior dimension conforms to said selected form factor.

* * * * *